United States Patent [19]
Kang

[11] Patent Number: 5,955,774
[45] Date of Patent: *Sep. 21, 1999

[54] INTEGRATED CIRCUIT FERROELECTRIC MEMORY DEVICES INCLUDING RESISTORS IN PERIPHERY REGION

[75] Inventor: Chang-seok Kang, Kyungki-do, Rep. of Korea

[73] Assignee: Samsung Electronics Co., Ltd., Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/873,641

[22] Filed: Jun. 12, 1997

[30] Foreign Application Priority Data

Jun. 17, 1996 [KR] Rep. of Korea ................... 96-21856

[51] Int. Cl.$^6$ .................................................. H01L 29/00
[52] U.S. Cl. ......................... 257/533; 257/295; 257/537
[58] Field of Search ............................. 257/71, 72, 295, 257/296, 532, 533, 537, 903; 438/240, 253, 384

[56] References Cited

U.S. PATENT DOCUMENTS

| | | | |
|---|---|---|---|
| 4,805,147 | 2/1989 | Yamanaka et al. | 365/154 |
| 4,982,309 | 1/1991 | Shepherd | 361/321 |
| 5,005,102 | 4/1991 | Larson | 361/313 |
| 5,475,248 | 12/1995 | Takenaka | 257/295 |

FOREIGN PATENT DOCUMENTS

| | | |
|---|---|---|
| 0 490 240 A2 | 12/1991 | European Pat. Off. . |
| 05013676 | 2/1993 | European Pat. Off. . |
| 0 697 720 A1 | 2/1996 | European Pat. Off. . |
| 6-125057 | 5/1994 | Japan . |

OTHER PUBLICATIONS

European Search Report, EP 97 30 4161, Sep. 25, 1998.
Ohno et al., "Memory Cell Capacitor With $Ba_xSr_{1-x}TiO_3$(BST) Film for Advanced DRAMs", 1994 Symposium on VLSI Technology Digest of Technical Papers, 1994, pp. 149–150.
Kwon et al., "Degradation–Free $Ta_2O_5$ Capacitor after BPSG Reflow at 850° C for High Density DRAMs", IEDM 93, pp. 53–55.

*Primary Examiner*—Jerome Jackson, Jr.
*Assistant Examiner*—George Eckert
*Attorney, Agent, or Firm*—Myers Bigel Sibley & Sajovec

[57] ABSTRACT

Integrated circuit ferroelectric memory devices include an integrated circuit substrate which includes a cell region and a periphery region. A plurality of ferroelectric memory cells are formed in the cell region, including a plurality of ferroelectric capacitors. The ferroelectric capacitors each include a lower electrode, a ferroelectric layer on the lower electrode, and an upper electrode on the ferroelectric layer opposite the lower electrode. A first material layer is included on the upper electrodes in the cell region, opposite the ferroelectric layer and on the integrated circuit substrate in the peripheral region. The first material layer, which may be a semiconductor layer or an insulator layer, forms a plurality of resistors in the periphery region. Thus, a semiconductor layer or an insulator layer can be used as a resistor in the periphery region of the memory device without deteriorating the capacitor characteristics. Adhesion of the upper electrode to interconnection layers which are subsequently formed and to dielectric films which are subsequently formed can also be enhanced by the first material layer.

15 Claims, 5 Drawing Sheets

INTEGRATED CIRCUIT FERROELECTRIC MEMORY DEVICES INCLUDING RESISTORS IN PERIPHERY REGION

FIELD OF THE INVENTION

This invention relates to integrated circuit memory devices and fabricating methods therefor, and more particularly to integrated circuit ferroelectric memory devices and fabricating methods therefor.

BACKGROUND OF THE INVENTION

The integration density of integrated circuit memory devices such as integrated circuit Dynamic Random Access Memories (DRAMs), generally continues to increase. With the increase in integration density, the unit area of each memory cell generally tends to decrease. As is well known to those having skill in the art, integrated circuit DRAM devices include a capacitor for each memory cell. As the unit area per cell is reduced, the capacitance also tends to be reduced. This reduction in capacitance may degrade the performance of the integrated circuit memory. For example, read accuracy may decrease and soft error rates may increase. Also, excessive amounts of power may be required for device operation at low voltage. Accordingly, there is a need to ensure a large enough cell capacitance, notwithstanding the decrease in area of the unit cell in highly integrated memory devices.

There are three general techniques which have been used in attempts to increase the capacitance of a memory cell within a unit cell area. As is well known to those having skill in the art, an integrated circuit capacitor generally includes a lower electrode, an upper electrode and a dielectric layer therebetween. The first technique for increasing capacitance per unit area is to form a thinner dielectric. The second technique is to increase the effective area of the capacitor within a defined surface area of the integrated circuit. The third technique is to use a material having a high dielectric constant for the dielectric.

Unfortunately, the first technique may produce problems because the reliability of device may deteriorate when using dielectric films of 100 Ångstroms or less in thickness, due to the generation of Fowler-Nordheim tunneling currents. The second technique may involve the formation of three-dimensional capacitor structures which may complicate the fabrication processes.

The third technique of using a material having a high dielectric constant for the capacitor dielectric has also been widely investigated. In particular, dielectric films formed using a ferroelectric material have been proposed. Ferroelectric materials include oxides of a Perovskite structure having a high dielectric constant, such as $PbZrTiO_3$ (PZT) or $BaSrTiO_3$ (BST). A ferroelectric material has a spontaneous polarization phenomenon, unlike a conventional dielectric film such as a silicon oxide film, a silicon nitride film or a tantalum oxide ($Ta_2O_5$) film, and a high dielectric constant of hundreds to approximately 1,000 in a bulk state. Thus, a dielectric film of a ferroelectric material which is 500 Å or more in thickness can be equivalent to an oxide thickness of 10 Å or less.

However, in order to use a ferroelectric material as the dielectric film of a capacitor, the electrode material formed on and under the dielectric film (i.e., the upper and lower electrode materials) may become important. The following conditions should be met for an electrode material of a capacitor using a ferroelectric material. First, a film of a Perovskite structure should be able to be formed on the electrode. Second, a low dielectric film should not be formed on an interface between the electrode and the ferroelectric film. Third, silicon or components of the ferroelectric material should not mutually diffuse. Fourth, the electrode should be easy to pattern. It has been found that platinum group metals having oxidation-resistance and high conductivity, including Platinum (Pt), Ruthenium (Ru) or Iridium (Ir), or conductive oxides such as $IrO_2$ or $RuO_2$, can be used for electrodes of a ferroelectric capacitor.

Integrated circuit memory devices generally include a cell region and a periphery region in an integrated circuit substrate. In a memory device including a conventional capacitor, which uses an oxide/nitride/oxide (ONO) film as the dielectric film and electrodes formed of polysilicon, resistors in the periphery region are also generally formed of the material which forms the upper electrode of the capacitor. Unfortunately, in a ferroelectric capacitor including an upper electrode formed of the platinum group metals or an oxide thereof, the resistance of the electrode may be excessively low. Thus, the upper electrode of the capacitor generally cannot be used as the resistor of the periphery region.

In general, resistors are used for a voltage generator and an RC delay in the periphery region, which generally require a resistance of several k $\Omega$. When the desired resistance is low, the resistor of the periphery region is generally formed of the polysilicon used for gate electrodes of a cell region. When the desired resistance is high, it is generally formed of the polysilicon used for an upper electrode of the capacitor. However, when the memory device is integrated on the order of several gigabytes, formation of the resistor may be limited, when ferroelectric material such as BST or PZT is used for the dielectric film of the capacitor, and the platinum group metals or conductive oxides are used for the electrodes of the capacitor, since it may be difficult to obtain a sufficient resistance. Also, since for the gate electrode of a highly integrated memory device, a structure having low resistance such as a tungsten/silicide ($WSi_x$) structure or a titanium silicide ($TiSi_x$)/polysilicon structure is generally used, it may also be difficult to obtain a sufficient resistance.

In Table 1, sheet resistances of electrode material of the capacitor having ferroelectric material and gate electrode material are shown.

TABLE 1

| ELECTRODE MATERIAL (1500 Å) | SHEET RESISTANCE ($\Omega/\square$) | GATE MATERIAL (1500 Å) | SHEET RESISTANCE ($\Omega/\square$) |
|---|---|---|---|
| Platinum (Pt) | 0.71 | $WSi_x$/poly-Si | 6–7 |
| Iridium (Ir) | 0.34 | $TiSi_x$/poly-Si | 2–3 |
| Ruthenium (Ru) | 0.49 | poly-Si | about 100 |

As shown in Table 1, the sheet resistance of gate electrodes having a structure of a low resistance or the upper electrode may be excessively low. Accordingly, when the materials are used for a resistor of the periphery region, the necessary length of the resistor may make it difficult to integrate. For example, if 1 µm of resistor width is used, in order to form a resistor of 1 k $\Omega$, polysilicon having a sheet resistance of 100 $\Omega/\square$ generally requires a length of 10 µm. $WSi_x$/polysilicon having a sheet resistance of 2 $\Omega/\square$ generally requires a length of 500 µm. Thus, the resistor may occupy much of the periphery region. Also, when platinum is used for the upper electrode of the ferroelectric capacitor, the upper electrode of the capacitor generally cannot be used for the resistor of the periphery region.

Referring to FIGS. 1 through 3B, fabricating methods for conventional ferroelectric capacitors will be described.

FIG. 1 is a cross-sectional view illustrating a first conventional method for forming a capacitor having a ferroelectric material, which is described in an article entitled "*A Memory Cell Capacitor With Ba$_x$Sr$_{1-x}$TiO$_3$ (BST) Film for Advanced DRAMs*" to Ohno et al., 1994 Symposium on VLSI Technology Digest of Technical Papers, pp. 149–150.

Referring to FIG. 1, the capacitor has a structure of a Pt lower electrode 2, a BST dielectric layer 4 and a Pt upper electrode 6. However, since Pt has a low sheet resistance, the upper electrode 6 generally cannot be used for the resistor of the periphery region. However, adhesion of the platinum 6 of the upper electrode to an aluminum film 8 of an interconnection layer formed on the platinum layer 6 is generally poor.

FIG. 2 is a cross-sectional view illustrating a second conventional manufacturing method of a capacitor having a ferroelectric material, described in U.S. Pat. No. 5,005,102 to Larson entitled "*Multilayer Electrodes for Integrated Circuit Capacitors*". In FIG. 2, a method of forming a multilayered upper electrode is shown. As shown in FIG. 2, a conductive barrier layer 17 is inserted between an upper electrode 16 and an interconnection metal layer 18. Compared to the structure shown in FIG. 1, the structure shown in FIG. 2 may have an advantage in that the adhesive characteristic of the upper electrode 16 to the interconnection metal layer 18 is enhanced. The structure may have a disadvantage in that the upper electrode of the capacitor generally cannot be used as a resistor of the periphery region. Reference numeral 12 denotes a lower electrode, and reference numeral 13 denotes an adhesion/barrier layer for enhancing adhesion and preventing mutual reaction between the lower electrode 12 to a dielectric film 14.

FIG. 3A is a cross-sectional view illustrating a third conventional manufacturing method of a capacitor having a ferroelectric material described in Japanese Patent JP6-125057. Between a platinum layer 36 and an aluminum layer 38 of an interconnection metal layer, a metal layer 37a having a high melting point such as titanium nitride (TiN) and tungsten-titanium (TiW) is inserted, to thereby prevent mutual diffusion of Al and Pt. Reference numeral 32 denotes a lower electrode and reference numeral 34 denotes a dielectric film.

FIG. 3B is a cross-sectional view illustrating a fourth conventional fabricating method of a ferroelectric capacitor, as described in U.S. Pat. No. 4,982,309 to Shepherd, entitled "*Electrodes for Electrical Ceramic Oxide Devices*". Between conductive oxide electrode 36 and a metal interconnection layer 38, a barrier layer 37b formed of a metal such as Ruthenium or Iridium, is inserted. Reference numeral 32 denotes a lower electrode and reference numeral 34 denotes a dielectric film.

Referring to FIGS. 3A and 3B, the upper electrode of the capacitor generally cannot be used for a resistor of a periphery region like in FIGS. 1 and 2. Also, in the case of FIG. 3A, the upper electrode, formed of platinum 36 and a metal layer 37a having a high melting point, contacts an interlayer insulating film (not shown), which is generally silicon oxide such as Borophosphorus Silicate Glass (BPSG) or Undoped Silicate Glass (USG). Accordingly, thermal treating at 600° C. or higher after the capacitor formation generally causes reaction of BPSG and TiN. The reaction of BPSG and TiN may generate stress, which may thereby deteriorate the characteristics of the capacitor, as disclosed in Kwon et al., "*Degradation-Free Ta$_2$O$_5$ Capacitor After BPSG Reflow at 850° C. for High Density DRAMs*", IEDM 93, 1993, pp. 53–56.

SUMMARY OF THE INVENTION

It is therefore an object of the present invention to provide improved integrated circuit ferroelectric memory devices and fabrication methods therefor.

This and other objects are provided, according to the present invention, by integrated circuit ferroelectric memory devices which include a first material layer on the upper electrodes in the cell region and which also forms a plurality of resistors in the periphery region. The first material layer can therefore be used as a resistor in the periphery region without deteriorating the capacitor characteristics. Adhesion of the upper electrode to interconnection layers and to dielectric films can also be enhanced.

In particular, integrated circuit ferroelectric memory devices according to the invention include an integrated circuit substrate which includes a cell region and a periphery region therein. A plurality of ferroelectric memory cells are included in the cell region, including a plurality of ferroelectric capacitors. The ferroelectric capacitors comprise a lower electrode, a ferroelectric layer on the lower electrode and an upper electrode on the ferroelectric layer opposite the lower electrode. A first material layer is included on the upper electrodes in the cell region opposite the ferroelectric layer, and on the integrated circuit substrate in the periphery region. The first material layer forms a plurality of resistors in the periphery region.

The upper and lower electrodes comprise materials selected from the group consisting of a platinum group metal and a conductive oxide. The platinum group metals are selected from the group consisting of Pt, Ru, Ir, Pd and Os. The conductive oxide is selected from the group consisting of IrO$_2$, platinum oxide, osmium oxide, indium oxide, indium tin oxide (ITO) and RuO$_2$. The ferroelectric layer is selected from the group consisting of an oxide having Perovskite structure Bi$_4$Ti$_3$O$_{12}$ and SrBi$_2$Ta$_2$O$_9$. The oxide having Perovskite structure is selected from the group consisting of PZT, PbTiO$_3$, PbLaTiO$_3$, BaTiO$_3$, BST (BaSrTiO$_3$) and STO (SrTiO$_3$).

A first material layer preferably has a sheet resistance between about 5 and 500 Ω/□. The first material layer comprises material selected from the group consisting of polysilicon, tungsten silicide, SiN, Al$_2$O$_3$, TiSi$_x$N$_y$ and TaSi$_x$N$_y$.

Integrated circuit ferroelectric memory devices according to the invention may also include a first barrier layer on the first material layer and an interconnection on the first barrier layer. The first barrier layer prevents reaction between the first material layer and the interconnection layer. The first barrier layer is selected from the group consisting of a double film of Ti/TiN, Ir, Ru, RuO$_2$, TiSi$_x$N$_y$, TaSi$_x$N$_y$ and IrO$_2$.

In another embodiment, a second barrier layer may be provided between the upper electrode and the first material layer. The second barrier layer prevents reactions between the upper electrode and the first material layer. The second barrier layer is selected from the group consisting of TiSi$_x$N$_y$ and TaSi$_x$N$_y$. Integrated circuit ferroelectric memory devices according to the invention may also comprise an interconnection layer on the first material layer. In this case, the first material layer may also promote adhesion between the upper electrode and the interconnection layer. An insulating layer may also be provided on the first material layer, and the first material layer may promote adhesion between the upper electrode and the insulating layer.

Integrated circuit ferroelectric memory devices may be fabricated according to the present invention by defining a cell region and a periphery region in an integrated circuit substrate. A plurality of ferroelectric memory cells are fabricated in the cell region, including a plurality of ferroelectric capacitors. The ferroelectric capacitors comprise a lower electrode, a ferroelectric layer on the lower electrode and an upper electrode on the ferroelectric layer opposite the lower electrode. A first material layer is fabricated on the upper electrodes in the cell region opposite the ferroelectric layer, and on the integrated circuit substrate in the periphery region. The first material layer forms a plurality of resistors in the periphery region.

The first material layer forming step may be followed by the steps of forming an interlayer insulating layer on the first material layer, including a contact hole which exposes the first material layer. An interconnection layer is then formed on the interlayer insulating layer including in the contact hole. The contact hole may also expose the upper electrode. The materials for all of the layers and regions may be as described above.

DETAILED DESCRIPTION OF PREFERRED EMBODIMENTS

Figure 1:
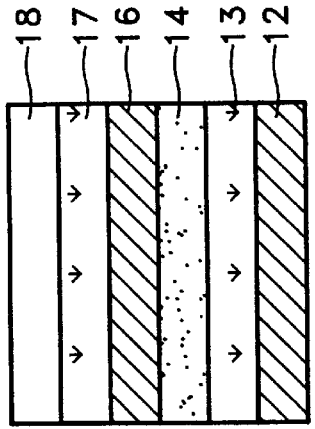
FIG. 1 is a cross-sectional view illustrating a first conventional ferroelectric capacitor.
Figure 2:
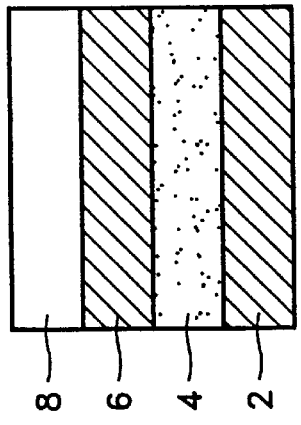
FIG. 2 is a cross-sectional view illustrating a second conventional ferroelectric capacitor.
Figure 3A:
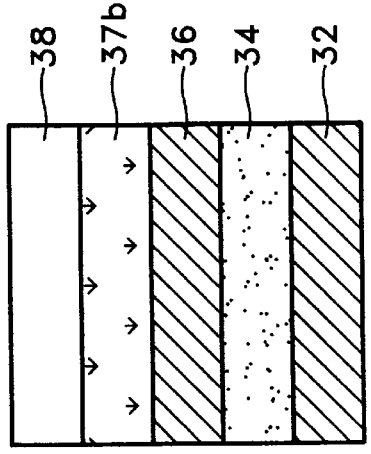
FIG. 3A is a cross-sectional view illustrating a third ferroelectric capacitor.
Figure 3B:
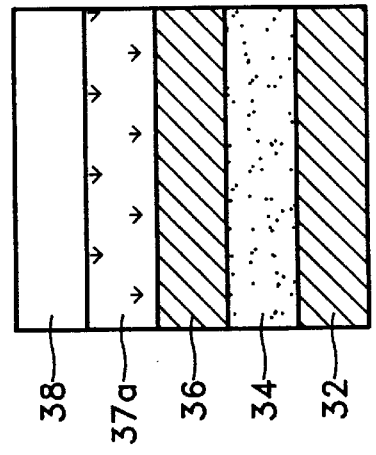
FIG. 3B is a cross-sectional view illustrating a fourth ferroelectric capacitor.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 4:
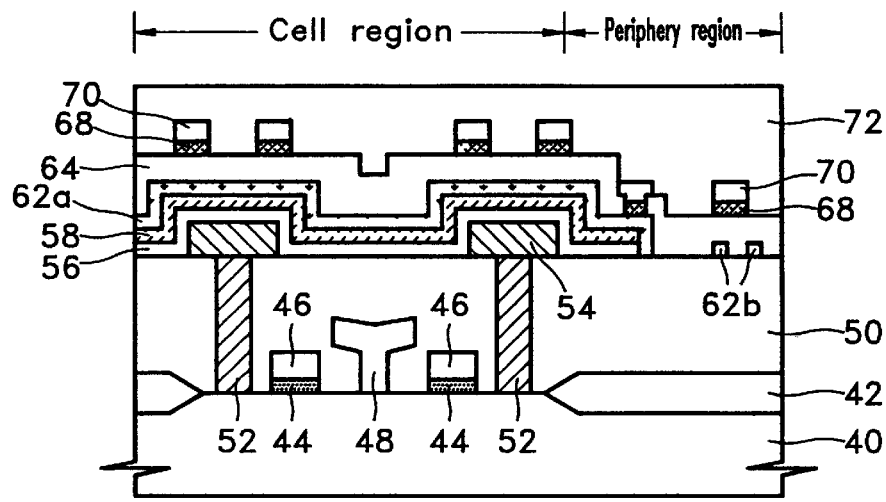
FIG. 4 is a cross-sectional view of a first embodiment of an integrated circuit ferroelectric memory device including a ferroelectric capacitor according to the present invention.

Referring to FIG. 4, reference numeral 40 denotes an integrated circuit substrate such as a semiconductor substrate and reference numeral 42 denotes a field oxide film for defining an active region and an inactive region. Reference numeral 44 denotes a gate insulating film such as an oxide film, a nitride film or an ONO film. Reference numeral 46 denotes a gate of polysilicon or polycide. Reference numeral 48 denotes a bit line connected to a drain of a transistor (not shown). Reference numerals 50 and 64 denote interlayer insulating films and reference numeral 52 denotes a plug for connecting a lower electrode of a capacitor to a source of the transistor (not shown).

Still referring to FIG. 4, reference numeral 54 denotes a lower electrode of the capacitor, reference numeral 56 denotes a ferroelectric dielectric film and reference numeral 58 denotes an upper electrode of the capacitor. Reference numeral 62a denotes a first material layer formed of a semiconductor or an insulator and reference numeral 62b denotes a resistor of the periphery region which is also formed of the first material layer. Reference numeral 68 denotes a barrier layer, reference numeral 70 denotes an interconnection layer and reference numeral 72 denotes a protective film.

The ferroelectric capacitor includes the lower electrode 54, the ferroelectric dielectric film 56 and the upper electrode 58. The upper and lower electrodes 58 and 54 are formed of material selected from the group consisting of Pt, Ru, Ir, Pd, $IrO_2$, a platinum oxide, an osmium oxide, an indium oxide, an Indium Tin Oxide (ITO) and $RuO_2$.

The dielectric film 56 is formed of material selected from the group consisting of an oxide having a Perovskite structure such as PZT, $PbTiO_3$, $PbLaTiO_3$, $BaTiO_3$, $BaSrTiO_3$ and $SrTiO_3$ or $Bi_4Ti_3O_{12}$ and $SrBi_2Ta_2O_9$.

On the upper electrode 58, first material layers 62a and 62b, which can enhance adhesion of an interconnection layer to the upper electrode and can also be used as a resistor of the periphery region, and comprise a semiconductor or an insulator having sheet resistance of approximately 5~500 $\Omega/\square$, are formed. Preferably, the first material layers 62a and 62b are formed of material selected from the group consisting of a semiconductor such as polysilicon or WSix, and an insulator such as SiN, $Al_2O_3$, $TiSi_2N_y$, $TaSi_xN_y$ and $Ti_xAl_yN_z$.

If the first material layers 62a and 62b are formed of a semiconductor such as polysilicon or silicide, a contact hole for connecting the interconnection layer 70 of a cell region to the first material layer 62a thereof may be formed directly on a surface of the first material layer 62a. In order to prevent mutual reaction and to form ohmic contact between the first material layer 62a and the interconnection layer 70, preferably a first barrier layer 68 can be further included. The first barrier layer 68 is formed of material selected from the group consisting of a double film of Ti/TiN, $TiSi_xN_y$, $TaSi_xN_y$, Ir and $IrO_2$.

Figure 6:
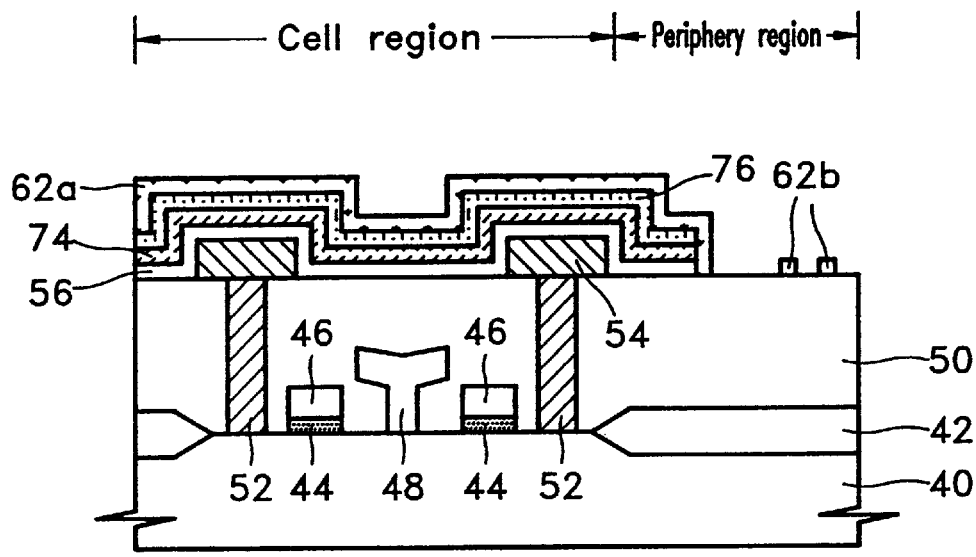
FIG. 6 is a cross-sectional view of a second embodiment of an integrated circuit ferroelectric memory device according to the present invention.

Also, as shown in FIG. 6, between the upper electrode 74 and the first material layer 62a of the cell region, a second barrier layer 76 for preventing mutual reaction of the upper electrode and the first material layer, may be further included. The second barrier layer 76 can be formed of the same material as that of the first barrier layer 68.

Figure 7:
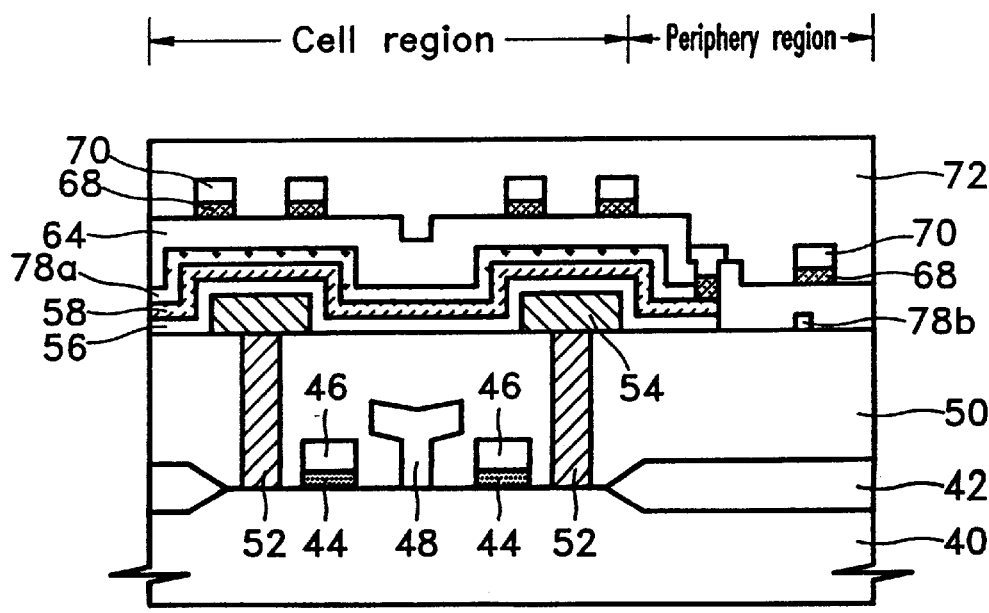
FIG. 7 is a cross-sectional view of a third embodiment of an integrated circuit ferroelectric memory device according to the present invention.

In FIG. 7, first material layers 78a and 78b, formed between an upper electrode 58 and an interconnection layer 70 can be formed of an insulator instead of a semiconductor such as polysilicon.

According to integrated circuit memory devices of the present invention, the first material layer formed of a semiconductor or an insulator having sheet resistance, which can be used for a resistor of a periphery region, is further included between the upper electrode of the capacitor having ferroelectric material and the interconnection layer. Thus, the adhesion of the interconnection layer to the upper electrode of the capacitor can be enhanced, and the first material layer can form the resistor of the periphery region.

Embodiment 1

Figure 5A:
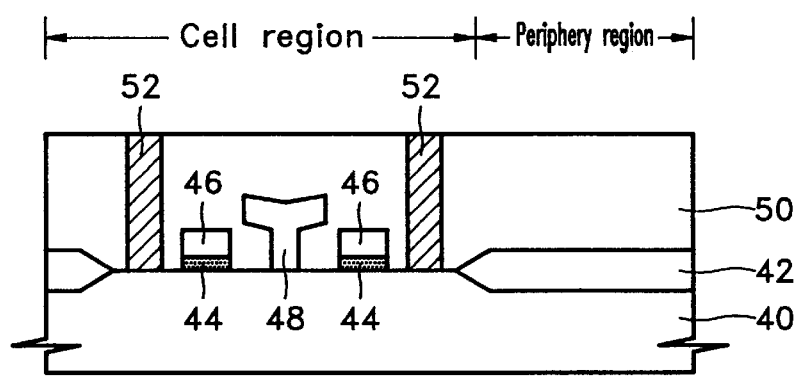
FIGS. 5A through 5G are cross-sectional views sequentially illustrating fabricating methods of integrated circuit ferroelectric memory devices according to FIG. 4.

FIG. 5A shows the steps of forming a memory cell transistor and a contact hole. An isolation film for isolating a semiconductor substrate into an active region and an inactive region is formed. A transistor is formed in the active region of the semiconductor substrate using conventional techniques. A bit line is formed connected to the drain of the transistor. An interlayer insulating layer is formed on the structure including on the bit line. A plug for connecting a source of the transistor and a lower electrode of the capacitor is formed.

In detail, a field oxide film 42 is formed on a semiconductor substrate 40 using a conventional isolation process such as LOcal Oxidation of Silicon (LOCOS), and then a transistor having a gate insulating film 44, a gate electrode 46 and a source/drain (not shown) are formed in a conventional manner. Subsequently, a bit line 48 contacting the drain of the transistor is formed, and then an insulating film is deposited on the entire surface of the structure, to thereby form an interlayer insulating film 50. Then, the interlayer insulating film 50 is partially etched, to thereby form a contact hole. The contact hole is filled with conductive material, to thereby form a plug 52 for connecting a source of the transistor to the lower electrode of the capacitor.

Figure 5B:
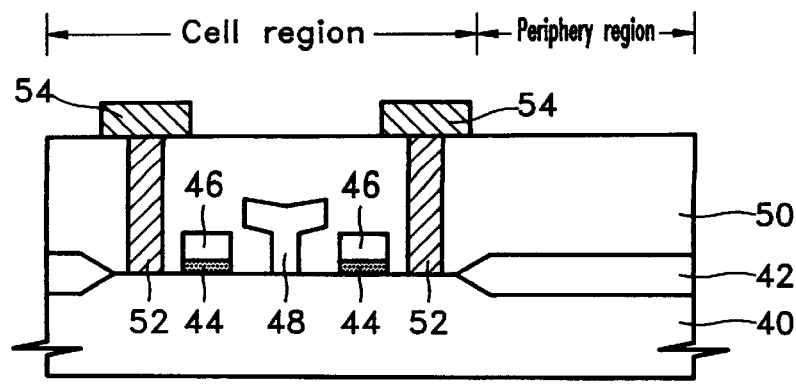

FIG. 5B shows the steps of forming lower electrode 54 of the capacitor. These steps are performed by depositing a platinum group metal or a conductive oxide, thereby forming a conductive layer, and patterning the conductive layer.

In detail, conductive material for forming the lower electrode of the capacitor is deposited to a thickness of approximately 100~3,000 Å, to thereby form a conductive layer. Then, the conductive layer is patterned using a conventional photolithography method, to thereby form the lower electrode 54 of the capacitor.

The material for forming the lower electrode 54 of the capacitor is selected from the group consisting of a conductive material having high conductivity and oxidation-resistance such as Pt, Ru, Ir, Pd or Os, a conductive oxide such as $IrO_2$, platinum oxide (PtO), osmium oxide ($OsO_2$), indium oxide ($In_2O_3$), Indium Tin Oxide (ITO), $RuO_2$, and a combination of the conductive materials with the conductive oxides.

Sputtering or chemical vapor deposition (CVD) is used to deposit the electrode material. For example, in order to deposit a platinum metal group by sputtering, the metal is used as a target in an argon (Ar) atmosphere, at a substrate temperature of 20~500° C. and at a chamber pressure of 1~10 mTorr. To deposit a platinum group metal oxide by radio frequency (RF) sputtering or reactive sputtering, the metal is used as a target in an atmosphere of mixed gases of Ar with $O_2$ of 5~50% and at a chamber pressure of 1~10 mTorr. To deposit platinum by a CVD method, platinum-hexafluoroacetyl acetonate $(Pt-HFA)_2$ is used as a platinum source. Here, Ar of 100~1,000 sccm is provided at a chamber pressure of 10 mTorr~10 Torr and at substrate temperature of 100~500° C.

Figure 5C:
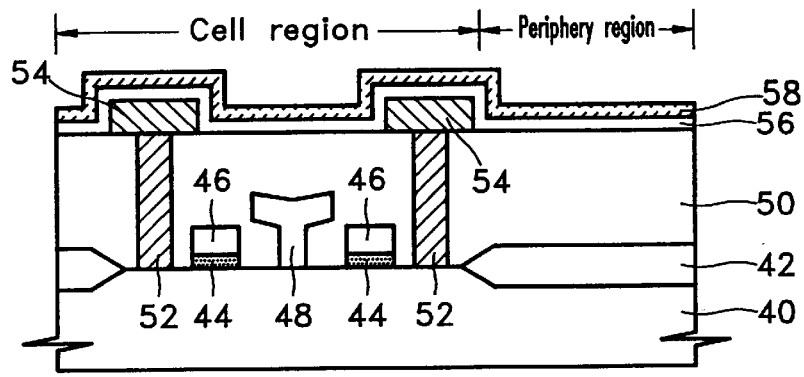

FIG. 5C shows the steps of forming a dielectric film 56 and a conductive layer 58 for an upper electrode of a capacitor. These steps are performed by depositing ferroelectric material on the structure of FIG. 5B, thereby forming a dielectric film, and by depositing a platinum group metal or a platinum oxide, thereby forming a conductive layer.

In detail, ferroelectric material such as PZT, is deposited on the structure where the lower electrode of the capacitor was formed, by sputtering or CVD, thereby forming the dielectric film 56. Then, a platinum group metal or a conductive oxide, is deposited on the dielectric film in the same manner as was described for forming the lower electrode 54, to thereby form the conductive layer 58 for an upper electrode.

The material for forming the dielectric film 56 is selected from the group consisting of an oxide having a Perovskite structure such as PZT, $PbTiO_3$, $PbLaTiO_3$, $BaTiO_3$, BST ($BaSrTiO_3$) and STO ($SrTiO_3$) or $Bi_4Ti_3O_{12}$, $SrBi_2Ta_2O_9$ can be used.

For example, in order to deposit the BST by sputtering, BST is used as a target under Ar and $O_2$ atmosphere. A substrate temperature of 450~650° C. and a chamber pressure of 1~10 mTorr are maintained. In order to deposit the BST by CVD, $Ba(DPM)_2$, $Sr(DPM)_2$ or Ti $(DPM)_2$ is used as a main component of the CVD source and an oxide gas including $O_2$ and $N_2O$ of 10~50% with Ar is provided into the chamber, in which the substrate temperature is 450~800° C. and the chamber pressure is 0.1~10 Torr.

Figure 5D:
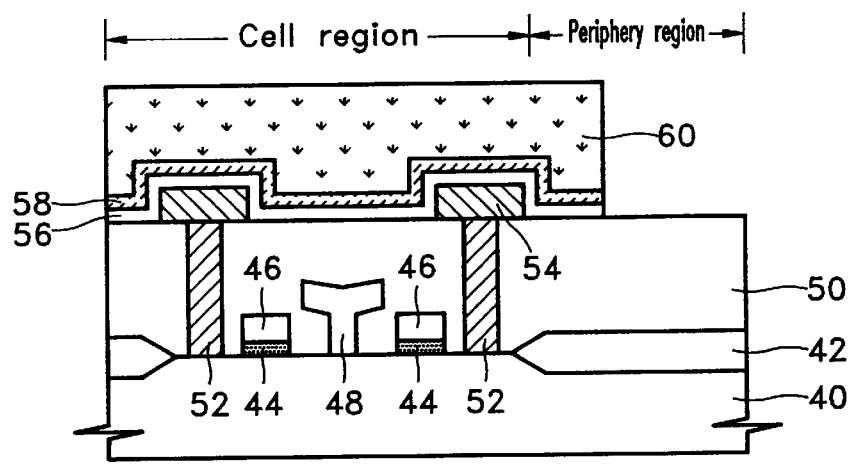

FIG. 5D shows the steps of photolithography for patterning the conductive layer 58 for an upper electrode. Patterning is performed by forming a photoresist pattern on the conductive layer for the upper electrode and patterning the conductive layer for the upper electrode and the dielectric film.

In detail, a material such as a photoresist is spin-coated to a thickness of 0.5–5 $\mu$m, and then the coated photoresist is exposed and developed, thereby forming a photoresist pattern 60 for exposing the conductive layer 58 for the upper electrode of the periphery region. Then, the conductive layer 58 for the upper electrode of the periphery region and the dielectric film 56 thereof are etched, using the photoresist pattern 60 as a mask. Here, the conductive layer 58 for the upper electrode can be etched by wet or dry etching. As the etchant, a mixture of HCl and $HNO_3$ can be used for wet-etching, or a mixed gas of $O_2$ and $Cl_2$ can be used for the dry-etching.

Figure 5E:
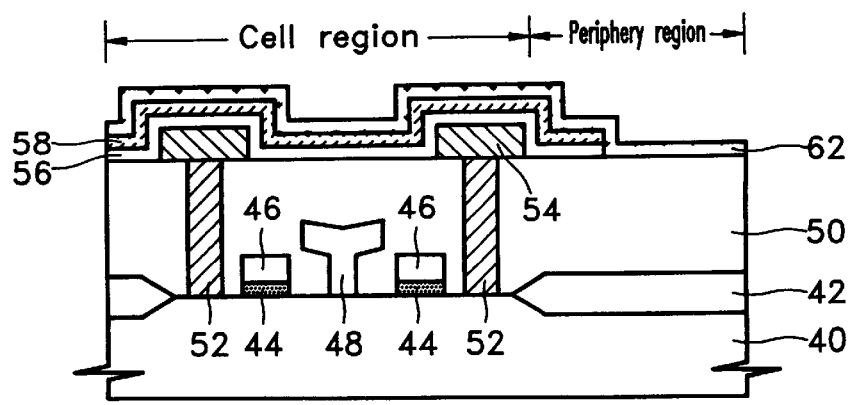

FIG. 5E shows the step of forming a first material layer 62. The step is performed by removing the photoresist pattern and depositing polysilicon.

In detail, the photoresist pattern is removed, and then on the entire surface of the cell region and the periphery region, a semiconductor or insulator such as polysilicon, which can be used as a resistor of the periphery region, is deposited, to thereby form the first material layer 62. The first material layer 62 can be used as a barrier layer for enhancing adhesion of the upper electrode to the interconnection layer in the cell region and also can be used for a resistor in the periphery region.

In order to form a polysilicon film for the first material layer 62, $SiH_4$ or $SiH_2Cl_2$ is used as a source and a dopant source including $PH_3$ is implanted into a chamber, and a CVD method is used at a substrate temperature of 550~750° C.

The thickness and doping concentration of the polysilicon film 62 should be controlled appropriately such that the sheet resistance of the polysilicon film is 5~500 $\Omega/\square$, which is the sheet resistance Rs generally required for resistance of the periphery region.

According to an embodiment of the present invention, it is preferable that the thickness of the polysilicon film is approximately 100~3,000 Å. In order to obtain the appropriate sheet resistance, the doping concentration of the polysilicon film is controlled by adding a dopant into the chamber during a CVD process or by depositing undoped polysilicon, and then performing ion-implantation or diffusion. Silicide such as $WSi_x$, $TiSi_x$, $TiSi_xN_y$ and $TaSi_xN_y$ or an insulating film such as SiN or $Al_2O_3$, instead of the polysilicon film 62, can be used.

Figure 5F:
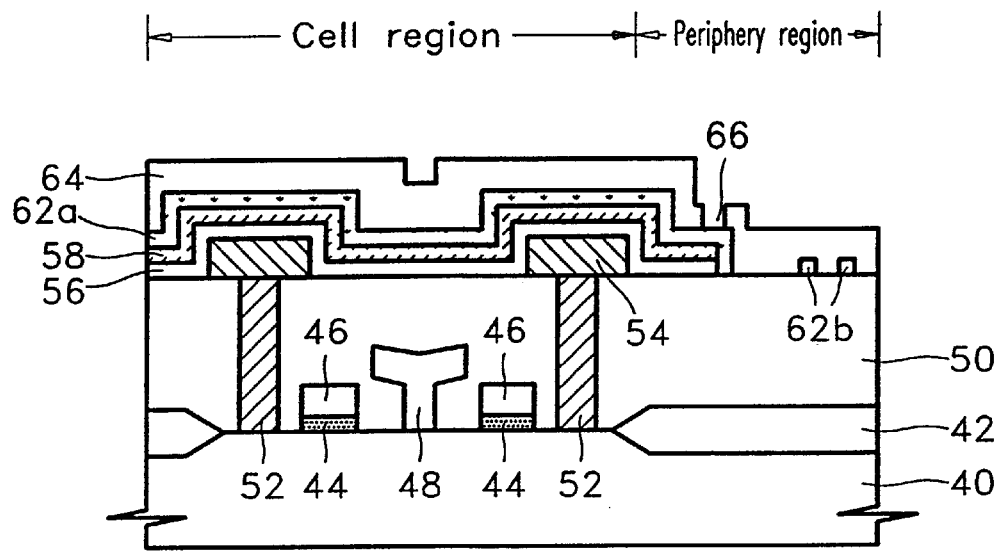

FIG. 5F shows the steps of forming an interlayer insulating film 64 and a contact hole 66. These steps are performed by patterning the polysilicon film, depositing an insulator on the patterned polysilicon, thereby forming the interlayer insulating film, and etching the interlayer insulating film, thereby forming a contact hole for connecting the upper electrode of the capacitor and the interconnection layer thereof.

In detail, the first material layer 62 is patterned by conventional photolithography, to thereby form a first material layer pattern, which can be used for the barrier layer 62a for enhancing adhesion of the upper electrode 58 of the capacitor to the interconnection layer thereof, and can be used for the resistor 62b having a predetermined resistance in the periphery region. Then, material selected from the group consisting of BPSG, PSG, SG, SOG, USG, and a combination thereof, is deposited on the resultant structure to a predetermined thickness of approximately 2,000~10,000 Å, to thereby form an interlayer insulating film 64.

Then, the interlayer insulating film 64 is partially etched by photolithography, to thereby form a contact hole 66 for connecting the upper electrode of the capacitor to the interconnection layer thereof. Here, the contact hole 66 can be formed, with a surface of the first material layer 62a exposed or with a surface of the upper electrode layer 58 portion under the first material layer exposed.

Figure 5G:
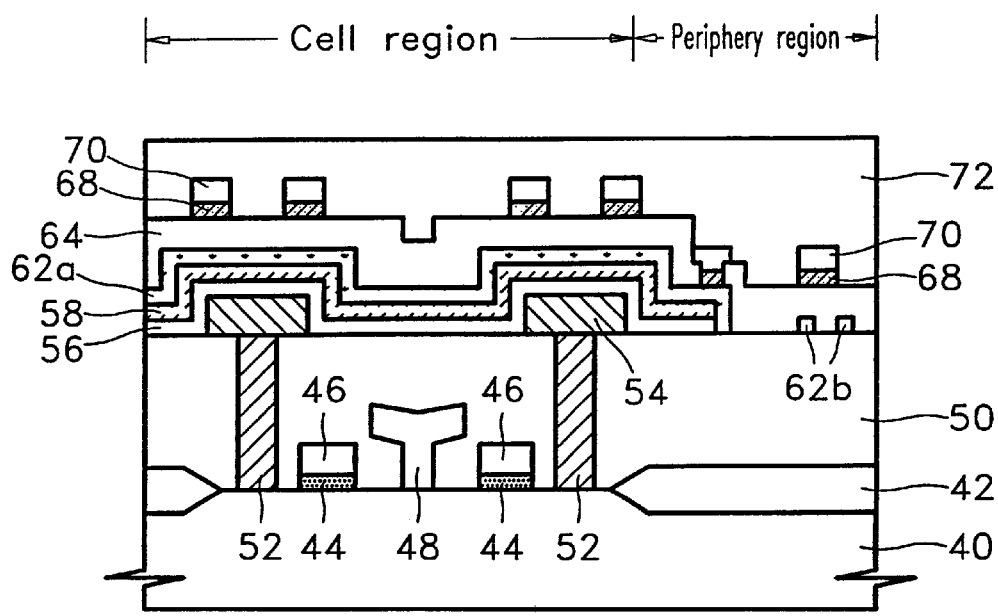

FIG. 5G shows the steps of forming a barrier layer 68, an interconnection layer 70 and a protective film 72. The steps are performed by forming the barrier layer 68 on the structure where the contact hole is formed, and by depositing interconnection metal on the structure, thereby forming the interconnection layer 70, patterning the interconnection layer and the barrier layer, and forming the protective film 72 on the structure.

In detail, on the structure where the contact hole is formed, material selected from the group consisting of a double film of Ti/TiN, $TiSi_xN_y$, $TaSi_xN_y$, Ir and $IrO_2$ is deposited to a thickness of 100~1,000 Å, to thereby form the barrier layer 68 for preventing mutual diffusion of the first material layer 62a and the interconnection layer, and also forming an ohmic contact between the first material layer 62a and the interconnection layer. Then, a metal such as Aluminum for interconnection, is deposited to a thickness of approximately 3,000~10,000 Å. The barrier layer 68 and the interconnection layer 70 are then patterned by photolithography. Then, a process of forming the protective layer 72 and succeeding process steps are performed using conventional DRAM fabrication processes.

According to the first embodiment, on the upper electrode layer of the capacitor having ferroelectric material, a resistor for the periphery region is deposited. Thus, the resistor for the periphery region can be concurrently formed during formation of the capacitor, and adhesion of the upper electrode layer to the interconnection layer is enhanced, and reliability can be enhanced. Also, the first material layer prevents stress due to reaction with an interlayer insulating film to be deposited.

Embodiment 2

Referring to FIG. 6, the corresponding material layers are denoted by the reference numerals used in the first embodiment. The second embodiment is suitable for preventing the mutual diffusion of an upper electrode of a capacitor and a first material layer, i.e., for forming the upper electrode using Pt.

The fabricating method of this embodiment involves the steps of forming a first barrier layer which is formed of Platinum on an upper electrode layer 74, forming the first material layer on the first barrier layer, exposing the first material layer of the periphery region by photolithography and patterning the first material layer, the first barrier layer and the upper electrode layer.

In detail, by the same method as that of the first embodiment, a Platinum layer 74 is formed as a conductive layer for the upper electrode. Then, in order to prevent reaction of the Pt layer 74 and a polysilicon film 62a formed at the first material layer, material for preventing reaction of Pt and polysilicon, i.e., TiN, Ir, $IrO_2$, $RuO_2$ or Ru, $TiSi_xN_y$, $TaSi_xN_y$ is deposited on the platinum layer 74 to a thickness of 100~1,000 Å by sputtering, to thereby form a first barrier layer 76. The processes of forming the polysilicon film, patterning the upper electrode layer, and forming a contact hole, which can be performed by the same method as that in the first embodiment, will not be described again.

According to the fabricating method of a capacitor having ferroelectric material of the second embodiment, in addition to a first material layer, which is used for a resistor of a periphery region, a barrier layer for preventing the mutual reaction of the first material layer and the upper electrode layer is also formed, to thereby enhance reliability.

Embodiment 3

Referring to FIG. 7, the corresponding material layers are denoted by the reference numerals used in the first and second embodiments. The third embodiment is suitable for cases where an insulator instead of a semiconductor such as polysilicon is used as the first material layers 78a and 78b formed between the upper electrode 58 and the interconnection layer 70. Here, the insulator is $SiO_2$, $Al_2O_3$ or SiN. Other processes which can be performed by the same method as that in the first embodiment will not be described. However, where an insulator instead of a semiconductor is used, as shown in FIG. 7, a contact hole for connecting the interconnection layers 68 and 70 to the upper electrode 58 in a cell region, is formed by etching the insulator layer 78a to expose a surface of the upper electrode 58.

According to integrated circuit memory devices having a ferroelectric capacitor material of the present invention and a manufacturing method thereof, a semiconductor layer or an insulator layer is deposited on the upper electrode of the capacitor. Accordingly, the semiconductor layer or the insulator layer can be used for a resistor of a periphery region without deterioration of capacitor characteristics. Adhesion of the upper electrode to the interconnection layer can be enhanced, and adhesion of the upper electrode to a dielectric film is improved. Also, a layer without stress, which is caused by a reaction with the interlayer insulating film, is formed between the electrode and the interlayer insulating film, to thereby prevent deterioration of capacitance in a subsequent process.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit ferroelectric memory device comprising:

an integrated circuit substrate which includes a cell region including therein a plurality of ferroelectric memory cells and a periphery region that is laterally spaced apart from the plurality of ferroelectric memory cells in the cell region;

the plurality of ferroelectric memory cells in the cell region including a plurality of ferroelectric capacitors, the ferroelectric capacitors comprising a lower electrode, a ferroelectric layer on the lower electrode, and an upper electrode on the ferroelectric layer opposite the lower electrode; and a first material layer comprising material that is different from the upper electrodes, on the upper electrodes in the cell region opposite the ferroelectric layer, and on the integrated circuit substrate in the periphery region that is laterally spaced apart from the plurality of ferroelectric memory cells in the cell region, the first material layer forming a plurality of resistors in the periphery region that are laterally spaced apart from the plurality of ferroelectric memory cells in the cell region.

2. An integrated circuit ferroelectric memory device according to claim 1, wherein the upper and lower electrodes comprise material selected from the group consisting of a platinum group metal and a conductive oxide.

3. An integrated circuit ferroelectric memory device according to claim 2, wherein the platinum group metal is selected from the group consisting of Pt, Ru, Ir, Pd and Os.

4. An integrated circuit ferroelectric memory device according to claim 2, wherein the conductive oxide is selected from the group consisting of $IrO_2$, platinum oxide, Osmium oxide, Indium oxide, Indium Tin Oxide (ITO) and $RuO_2$.

5. An integrated circuit ferroelectric memory device according to claim 1, wherein the ferroelectric layer comprises material selected from the group consisting of an oxide having Perovskite structure, $Bi_4Ti_3O_{12}$ and $SrBi_2Ta_2O_9$.

6. An integrated circuit ferroelectric memory device according to claim 5, wherein the oxide having Perovskite structure is selected from the group consisting of PZT, $PbTiO_3$, $PbLaTiO_3$, $BaTiO_3$, BST ($BaSrTiO_3$) and STO ($SrTiO_3$).

7. An integrated circuit ferroelectric memory device according to claim 1, wherein the first material layer has sheet resistance of between about 5 and 500 $\Omega/\square$.

8. An integrated circuit ferroelectric memory device according to claim 7, wherein the first material layer comprises material selected from the group consisting of polysilicon, tungsten silicide, SiN, $Al_2O_3$, $TiSi_xN_y$ and $TaSi_xN_y$.

9. An integrated circuit ferroelectric memory device of claim 1, further comprising a first barrier layer on the first material layer, and an interconnection layer on the first barrier layer, wherein the first barrier layer prevents reaction between the first material layer and the interconnection layer.

10. An integrated circuit ferroelectric memory device according to claim 9, wherein the first barrier layer is selected from the group consisting of a double film of Ti/TiN, Ir, Ru, $RuO_2$, $TiSi_xN_y$, $TaSi_xN_y$ and $IrO_2$.

11. An integrated circuit ferroelectric memory device according to claim 1, further comprising a barrier layer between the upper electrode and the first material layer, which prevents reaction between the upper electrode and first material layer.

12. An integrated circuit ferroelectric memory device according to claim 11, wherein the barrier layer is selected from the group consisting of Ti/TiN, Ir, Ru, $RuO_2$, $TiSi_xN_y$ and $TaSi_xN_y$.

13. An integrated circuit ferroelectric memory device according to claim 9, further comprising a second barrier layer between the upper electrode and the first material layer, which prevents reaction between the upper electrode and first material layer.

14. An integrated circuit ferroelectric memory device according to claim 1 further comprising an interconnection layer on the first material layer, and wherein the first material layer promotes adhesion between the upper electrode and the interconnection layer.

15. An integrated circuit ferroelectric memory device according to claim 1 further comprising an insulating layer on the first material layer, and wherein the first material layer promotes adhesion between the upper electrode and the insulating layer.

* * * * *